United States Patent
Tsai et al.

(10) Patent No.: US 6,479,389 B1
(45) Date of Patent: Nov. 12, 2002

(54) METHOD OF DOPING COPPER METALLIZATION

(75) Inventors: Ming-Hsing Tsai, Taipei (TW); Sheng Hsiang Chen, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/412,632

(22) Filed: Oct. 4, 1999

(51) Int. Cl.$^7$ .......................................... H01L 21/302
(52) U.S. Cl. ................. 438/697; 438/691; 438/698; 438/720; 438/687; 438/660; 438/652; 438/637; 438/643
(58) Field of Search ................. 438/691, 692, 438/697, 698, 702, 703, 720, 687, 660, 661, 662, 663, 652, 653, 637, 643, 644

(56) References Cited

U.S. PATENT DOCUMENTS

| | | |
|---|---|---|
| 5,719,447 A | 2/1998 | Gardner ................. 257/762 |
| 6,814,557 * | 9/1998 | Venkatraman et al. ...... 438/622 |
| 5,891,802 A | 4/1999 | Tao et al. ................. 438/656 |
| 5,891,804 A | 4/1999 | Havemann et al. ......... 438/674 |
| 5,969,422 A * | 10/1999 | Ting et al. ................. 257/762 |
| 6,015,749 A * | 1/2000 | Lin et al. ................. 438/628 |
| 6,037,257 A * | 3/2000 | Chiang et al. ............. 438/687 |
| 6,181,012 B1 * | 1/2001 | Edelstein et al. .......... 257/762 |
| 6,022,808 A1 * | 2/2001 | Nogami et al. ............ 438/694 |

FOREIGN PATENT DOCUMENTS

| | | | |
|---|---|---|---|
| JP | 05-311424 | * | 11/1993 |
| JP | 11-204524 | * | 7/1999 |

* cited by examiner

*Primary Examiner*—George Goudreau
(74) *Attorney, Agent, or Firm*—George O. Saile; Stephen B Ackerman

(57) ABSTRACT

This invention describes two new methods to form copper alloy films. In the first embodiment of this invention physical vapor deposition (PVD) or sputtering of a copper alloy film, is then followed by a chemical vapor deposition (CVD) or electro-chemical deposition (ECD) of a layer of pure copper. In the second embodiment of this invention chemical vapor deposition (CVD) or electro-chemical deposition (ECD) deposits a layer of pure copper, which is then followed by physical vapor deposition (PVD) or sputtering of a copper alloy film. In yet another embodiment to these methods, special, separate low temperature annealing steps follow said methods to enhance copper alloy formation. By the two deposition techniques briefly described above, high aspect ratio vias and trenches can be filled with copper corrosion and electromigration resistant alloys.

10 Claims, 1 Drawing Sheet

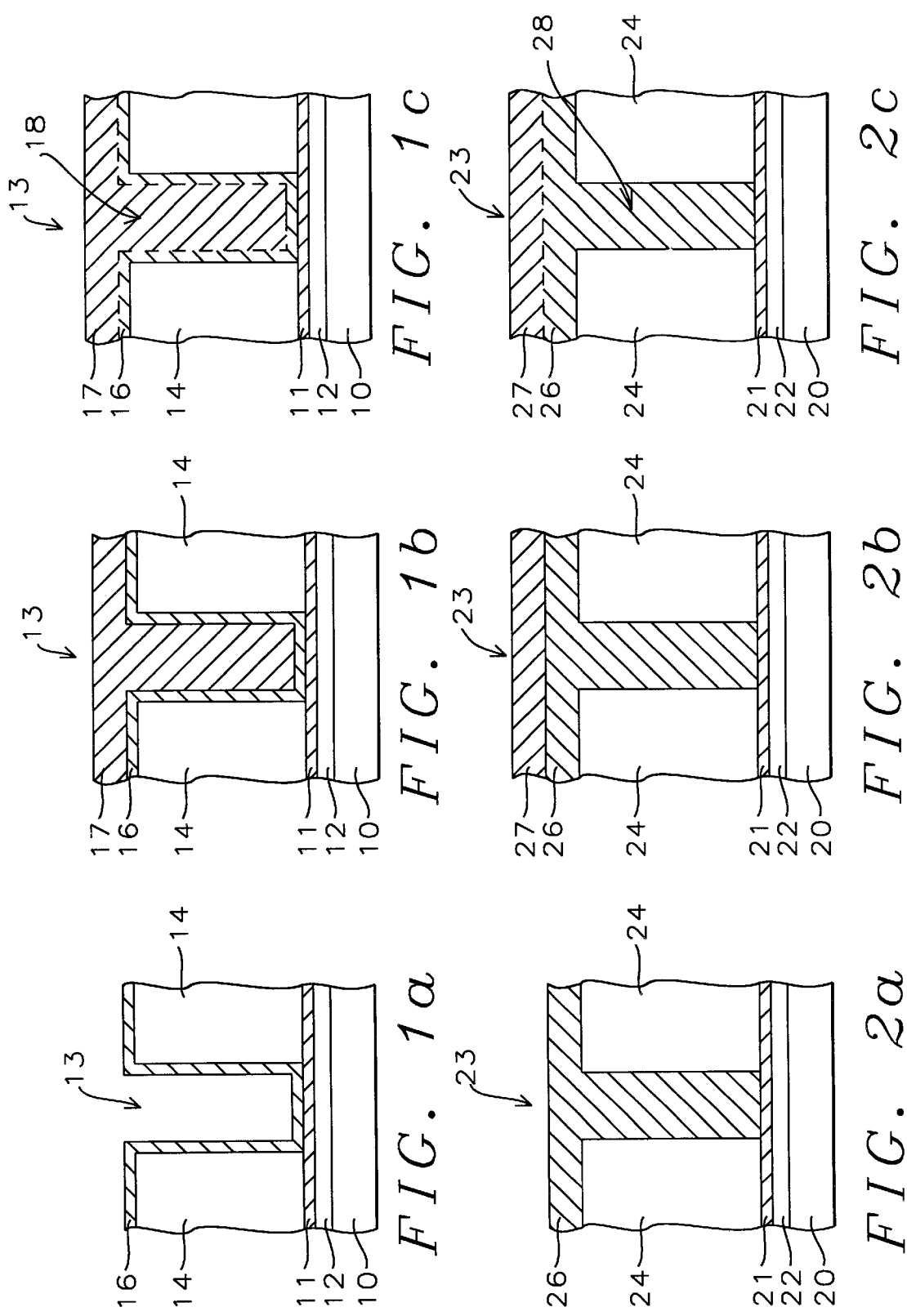

METHOD OF DOPING COPPER METALLIZATION

BACKGROUND OF THE INVENTION

1. Field of the Invention

It is a general object of the present invention to provide a new and improved method of forming an integrated circuit in which special copper alloy films are formed by a combination of physical vapor deposition (PVD) and chemical vapor deposition (CVD) or electro-chemical deposition (ECD) techniques. By said techniques, high aspect ratio vias and trenches can be filled with copper corrosion/oxidation and electromigration resistant alloys.

As a background to the current invention, the requirement of lower resistance material has been more stringent as the device dimensions approach micron and sub-micron design ground rules. Pure copper metal lines have been one of the best choices because of copper's low resistivity and high conductivity. However, pure copper films are easily oxidized. Alloying copper with other elements, such as, Zr, Al, Ti, Sn, Zn, Mg aides in preventing copper oxidation/corrosion, by forming a dense passivating oxide on the copper surface. Furthermore, alloying of copper will improve the electromigration (EM) resistance of copper, due to a reduction in grain boundary diffusion.

This invention describes the formation of special copper alloy films by using a combination of physical vapor deposition (PVD) and chemical vapor deposition (CVD) or electro-chemical deposition (ECD) techniques. By said techniques, high aspect ratio vias and trenches can be filled with copper corrosion/oxidation and electromigration resistant alloys.

2. Description of Related Art

The present invention is a new and improved method for fabricating special copper alloy films by using a combination of physical vapor deposition (PVD) and chemical vapor deposition (CVD) or electro-chemical deposition (ECD) techniques. By said techniques, high aspect ratio vias and trenches can be filled with copper corrosion/oxidation and electromigration resistant alloys. High conductivity, low resistivity conducting metal lines are important in fabricating quarter micron and below semiconductor devices. The related Prior Art background patents will now be described in this section.

U.S. Pat. No. 5,891,804 entitled "Process for Conductors with Selective Deposition", granted Apr. 6, 1999 to Havemann and Stuitz shows a copper seed layer and a copper layer there over. This is a method of forming a conductor on an interlevel dielectric layer which is over an electronic microcircuit substrate, and the structure produced thereby. The method utilizes: forming an interlevel dielectric layer over the interlevel dielectric layer; forming a conductor groove in the intralevel dielectric layer exposing a portion of the interlevel dielectric layer; anisotropically depositing a selective deposition initiator onto the intralevel dielectric layer and onto the exposed portion of the interlevel dielectric layer; and selectively depositing conductor metal to fill the groove to at least half-full. The selective deposition initiator may be selected from the group consisting of tungsten, titanium, palladium, platinum, copper, aluminum, and combinations thereof. In one embodiment, the selective deposition initiator is palladium, and the selectively deposited conductor metal is principally copper.

U.S. Pat. No. 5,891,802 entitled "Method for Fabricating a Metallization Stack Structure of Improve Electromigration Resistance and Keep Low Resistivity of ULSI Interconnects" granted Apr. 6, 1999 to Tao and Fang shows a pure copper layer sandwiched between two doped copper layers. There is described a metallization stack structure and a method for fabricating the same so as to produce a higher electromigration resistance and yet maintain a relatively low resistivity. The metallization stack structure includes a pure copper layer sandwiched between a top thin doped copper layer and a bottom thin doped copper layer. The top and bottom thin doped copper layers produce a higher electromigration resistance. The pure copper layer produces a relatively low resistivity. Note, doped copper layers increase line resistance and therefore must be thin contributing only a small cross-section of the conducting line.

U.S. Pat. No. 5,719,447 entitled "Metal Alloy Interconnections for Integrated Circuits" granted Feb. 17, 1998 to Gardner shows a barrier layer, and a physical vapor deposited (PVD) sputtered copper alloy layer. The metal-alloy interconnects of this invention comprise a substantial portion of either copper or silver alloyed with a small amount of an additive having a low residual resistivity and solid solubility in either silver or copper such that the resultant electrical resistivity is less than 3 micro-Ohm-cm The present invention is directed to a novel and improved method of fabrication an integrated circuit, in which special copper alloy films are formed by a combination of physical vapor deposition (PVD) and chemical vapor deposition (CVD) or electro-chemical deposition (ECD) techniques. The methods of the present invention make efficient use of several process steps resulting in less processing time, lower costs and higher device reliability. By said techniques, high aspect ratio vias and trenches can be filled with copper corrosion/oxidation and electromigration resistant alloys.

SUMMARY OF THE INVENTION

It is a general object of the present invention to provide a new and improved method of forming an integrated circuit in which special copper alloy films are formed by combination of physical vapor deposition (PVD) and chemical vapor deposition (CVD) or electro-chemical deposition (ECD) techniques. By said techniques, high aspect ratio vias and trenches can be filled with copper corrosion/oxidation and electromigration resistant alloys.

Prior Art methods provide the following consisting of: a semiconductor silicon substrate with the first level of metal copper wiring being defined, embedded in the first layer of insulator, silicon oxide $SiO_x$. The invention starts with these conventional layers being provided by Prior Art methods, in addition, to patterned and etched via holes and trenches (channels) in deposited insulating material. Also provided by Prior Art methods, can be a metal "seed layer" and metal diffusion barrier layer beneath the metal copper wiring layers. To obtain adequate liner coverage using collimated reactive sputtered, physical vapor deposition (PVD), TaN, Ti/TiN, TiN, WN liners (diffusion barrier) and seed layers, a larger liner thickness must be applied.

Copper alloys have been found to be of advantage in the prevention of oxidation of copper and improving electromigration (EM) resistance of copper films. However, the primary method of forming copper alloys is by physical vapor deposition (PVD), a sputtering method which uses a sputtering target composed of the copper alloy. The copper films deposited from PVD methods have poor conformality and are not applicable for good planar gap fill properties. However, chemical vapor deposition (CVD) or electro-chemical deposition (ECD) of pure copper can fill high aspect ratio vias and trenches. Note, for chemical vapor deposition (CVD) or electro-chemical deposition (ECD), only pure copper films can be deposited. This invention describes two new methods to form copper alloy films, copper alloying with, e.g., Zr, Al, Ti, Sn, Zn, Mg.

In the first embodiment of this invention physical vapor deposition (PVD) or sputtering of a copper alloy film, i.e., Zr, Al, Ti, Sn, Zn, Mg, is then followed by a chemical vapor deposition (CVD) or electro-chemical deposition (ECD) of a layer of pure copper.

In the second embodiment of this invention chemical vapor deposition (CVD) or electro-chemical deposition (ECD) deposits a layer of pure copper, which is then followed by physical vapor deposition (PVD) or sputtering of a copper alloy film, e.g., doped with Zr, Al, Ti, Sn, Zn, Mg.

In yet another embodiment to these methods, special, separate annealing steps follow said methods to enhance copper alloy formation. By the two deposition techniques briefly described above, high aspect ratio vias and trenches can be filled with copper corrosion and electromigration resistant alloys.

Note, elements which easily from metal alloys with copper, face centered cubic crystal structure (fcc), in a solid state solution, are those which possess the following properties: crystal structure the same or close to face centered cubic (fcc) of copper, the same or close to the atomic packing of copper, close in atomic size to metallic copper, (also close in ionic size and close in valence to copper).

The final process steps are chemical mechanical polish (CMP) of excess conducting metal, in a manner to form conducting lines and vias without dishing.

In summary, some of the advantages of this invention for alloying copper layers are firstly, the prevention of copper oxidation/corrosion by the forming a protective, passivating stable oxide. Enhanced electromigration (EM) resistance by hindering grain boundary (fast) diffusion, while still maintaining low resistivity (low sheet rho for conducting line) and high conductivity. Improved copper to silicon nitride and silicon dioxide adhesion. Prevention of hillock formation of copper, especially during deposition processes, i.e., copper sputtering. Finally, the key advantage of this invention, combining the deposition techniques of good planar via fill and conformality properties of both chemical vapor deposition (CVD) and electro-chemical deposition with physical vapor deposition (PVD) sputtering for doping of copper alloy.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1a, which in cross-sectional representation illustrates the initial starting point for the first embodiment of this invention, deposition of a seed layer and physical vapor deposition (PVD) sputtering of a copper alloy layer.

FIG. 1b, which in cross-sectional representation illustrates one key process step of this invention, the chemical vapor deposition (CVD) or electro-chemical deposition (ECD) of a planar thick layer of pure copper.

FIG. 1c, which in cross-sectional representation illustrates another key process step of this invention, the annealing of the copper layers to form copper alloys.

FIG. 2a, which in cross-sectional representation illustrates the initial starting point for the second embodiment of this invention, deposition of a seed layer and chemical vapor deposition (CVD) or electro-chemical deposition (ECD) of a planar thick layer of pure copper.

FIG. 2b, which in cross-sectional representation illustrates one key process step of this invention, the physical vapor deposition (PVD) sputtering of a copper alloy layer.

FIG. 2c, which in cross-sectional representation illustrates another key process step of this invention, the annealing of the copper layers to form copper alloys.

DESCRIPTION OF THE PREFERRED EMBODIMENTS

It is a general object of the present invention to provide a new and improved method of forming an integrated circuit in which special copper alloy films are formed by a combination of physical vapor deposition (PVD) and chemical vapor deposition (CVD) or electro-chemical deposition (ECD) techniques. By said techniques, high aspect ratio vias and trenches can be filled with copper corrosion/oxidation and electromigration resistant alloys.

Copper alloys have been found to be of advantage in the prevention of oxidation of copper and improving electromigration (EM) resistance of copper films. However, the method of forming copper alloys is primarily by physical vapor deposit (PVD), a sputtering method which has uses a sputtering target composed of the copper alloy. The copper films deposited from PVD methods have poor conformality and are not applicable for good gap fill properties. Chemical vapor deposition (CVD) or electro-chemical deposition (ECD) of pure copper can fill high aspect ratio vias and trenches. Note that the chemical vapor deposition (CVD) or electro-chemical deposition (ECD), only pure copper films can be deposited. This invention describes two new methods to form copper alloy films, which consists of combination of the above processes.

Referring FIG. 1a, which in cross-sectional representation, sketches the starting point for the first embodiment of this invention. As a background, provided by Prior Art methods are the following: a semiconductor silicon substrate 10 with the first level of metal copper wiring 11 being defined, embedded in the first layer of insulator 12, silicon oxide $SiO_x$. The invention starts with these conventional layers being provided by Prior Art methods, in addition, to patterned and etched via holes (not shown in Figs.) and trenches (channels) 13 in deposited insulating material 14. A metal "seed layer" and metal diffusion barrier layer beneath the metal copper wiring layers is deposited (too thin, not shown in Figs.). To obtain adequate liner coverage using collimated reactive sputtered, physical vapor deposition (PVD), TaN, Ti/TiN, TiN, WN liners (diffusion barrier) and seed layers, a larger liner thickness must be applied.

Referring again to FIG. 1a, which in cross-sectional representation illustrates the first embodiment of this invention which is the physical vapor deposition (PVD) or sputtering of a copper alloy film (16), with Zr, Al, Ti, Sn, Zn, Mg type alloying elements (film thickness from about 500 to 2,500 Angstroms).

Referring to FIG. 1b, which in cross-sectional representation illustrates the next process step in the first embodiment of this invention. Shown is the chemical vapor deposition (CVD) or electro-chemical deposition (ECD) of a thick layer of pure copper 17. Note, the pure copper film 17 tends to planarize the surface of trench (channel) 13.

Referring to FIG. 1c, which in cross-sectional representation illustrates the next process step in yet another embodiment of this invention. Shown is a special, annealing step, in inert atmosphere or vacuum, temperature from about 250 to 450° C., to enhance copper alloy formation 18 throughout the film, emanating as a diffusion source from alloy layer 16.

Referring FIG. 2a, which in cross-sectional representation, sketches the starting point for the second embodiment of this invention. As a background, provided by Prior Art methods are the following: a semiconductor silicon substrate 20 with the first level of metal copper wiring 21 being defined, embedded in the first layer of insulator 22, silicon oxide $SiO_x$. The invention starts with these conventional layers being provided by Prior Art methods, in addition, to patterned and etched via holes (not shown in Figs.) and trenches (channels) 23 in deposited insulating material 24. A metal "seed layer" and metal diffusion barrier layer beneath the metal copper wiring layers is deposited (too thin, not shown in Figs.). To obtain adequate liner coverage using collimated reactive sputtered, physical vapor deposition (PVD), TaN, Ti/TiN, TiN, WN liners (diffusion barrier) and seed layers, a larger liner thickness must be applied.

Referring again to FIG. 2a, which in cross-sectional representation illustrates the second embodiment of this invention, which is the chemical vapor deposition (CVD) or electro-chemical deposition (ECD) of a thick layer of pure copper 26. Note the thick copper layer 26 tends to planarize the surface. For completeness and showing diligence, the following are the chemical vapor deposition (CVD) conditions used for the present invention: reactant gases (hfac) Cu(tmvs), pressures of about 10 mTorr to 700 Torr, gas flows from about 10 sccm to 2 slm, temperatures about 150 to 250° C., deposition rates from about 50 to 2,000 Angstroms/min. In addition, the following are electro-chemical deposition (ECD) conditions used for the present invention: solution of sulfuric acid, temperature of about 25° C., deposition rate of about 1,000 to 10,000 Angstroms/min.

Referring to FIG. 2b, which in cross-sectional representation illustrates the next process step in the second embodiment of this invention. Shown is the relatively thick physical vapor deposition (PVD) or sputtering of a copper alloy film 27, with Zr, Al, Ti, Sn, Zn, Mg type alloying elements (film thickness from about 500 to 2,500 Angstroms). For completeness and showing diligence, the following are the physical vapor deposition (PVD) or sputtering conditions used for the present invention: target compositions of between 0.5 to 5 atomic percent with alloy compositions of approximately target compositions, Ar sputter gas pressures between 10 mTorr to 100 mTorr, power of from about 100 to 2,000 Watts, DC Magnetron with no reverse bias, DC volts from about 100 to 500 V, substrate temperatures from 100 to 300° C., deposition rates from 50 to 500 Angstroms/min.

Referring to FIG. 2c, which in cross-sectional representation illustrates the next process step in yet another embodiment of this invention. Shown in a special, annealing step, in inert atmosphere or vacuum, temperature from about 250 to 450° C., to enhance copper alloy formation 28 throughout the film, emanating as a diffusion source from alloy layer 27. For completeness and showing diligence, the following are conditions used for the present invention: all inert ambient or atmospheres of $N_2$, Ar, $H_2$, pressures from vacuum to 1 atmosphere, times from 30 sec to 2 hr. at temperatures from 250° to 450° C. Alloy compositions achieved by these two different methods achieve good resistivities of almost that of pure copper (close to single crystal), that is: near ~2 micro-Ohm-cm (for pure copper) with alloys in the resistivity range of from about 1.8 to 2.2 micro-Ohm-cm.

The final process steps are chemical mechanical polish (CMP) of excess conducting metal, in a manner to form conducting lines and vias without dishing.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit on a substrate to form alloyed copper interconnect lines and vias comprising the following:
   providing a substrate or module with integrated circuits therein;
   providing an interconnect wiring layer, or device contact regions to P-N junctions on the substrate;
   providing a first layer of insulator over the interconnect wiring layer, or device contact regions to P-N junctions;
   providing patterned and etched via holes and trenches in the first layer of insulator;
   depositing a via hole and trench barrier liner material, selected from the group consisting of TaN, TiN, WN, which is a diffusion barrier;
   depositing by chemical vapor deposition or electro-chemical deposition of a thick layer of pure copper, over the barrier liner material planarizing the surface;
   depositing an alloyed planar copper layer, selected from the group consisting of Al, Ti, Zn, copper alloying metals by physical vapor deposition, sputtering from an alloyed target;
   annealing by a low temperature annealing step between 250 to 450° C., to enhance copper alloy formation of all metal layers above;
   polishing the excess conducting metal back by chemical mechanical polishing and repeating the above process steps to make multilevel conducting layers, which are corrosion/oxidation and electromigration resistant, by this integrated method.

2. The method of claim 1, wherein said substrate is semiconductor single crystal silicon or is a ceramic module, with integrated circuits therein.

3. The method of claim 1, wherein the via hole and trench barrier liner material comprises a diffusion barrier liner, which also aids adhesion, liner type materials comprises of and selected from the group consisting of TaN, TiN, WN with nitride formed by reactive sputtering.

4. The method of claim 1, wherein the chemical vapor deposition or electro-chemical deposition of a thick layer of pure copper planarizes the trench/via surface and is in a thickness range from about 3,000 to 15,000 Angstroms.

5. The method of claim 1, wherein the alloyed planar copper layer, with a thickness from about 500 to 2,500 Angstroms, is comprised of the following copper alloying metals, selected from the group consisting of Al, Ti, Zn, sputter deposited by physical vapor deposition forming alloy dopant compositions in a range between 0.5 to 5.0 atomic percent dopant in copper, with the corresponding copper atomic percent in a range between 99.9 to 95.0.

6. The method of claim 1, wherein the annealing by low temperature annealing of pure copper and alloy layer to enhance copper metal alloy formation is performed in a low temperature range from about 250 to 450° C. in an inert atmosphere or in a vacuum.

7. The method of claim 1, wherein the conducting structures are fabricating by repeating the integrated process described herein to make multilevel conducting layers by this integrated method, adding a protective layer over the exposed copper and copper alloys during formation of the via holes and trench to prevent chemical attack.

8. The method of claim 1, wherein each level of conducting structure is planarized by removing excess conducting material, include planarization by chemical mechanical polish or etching.

9. The method of claim 1, wherein the unique copper metal alloyed conducting interconnect lines and via structures, produced by this process, have good fill properties for high aspect ratio vias and trenches, hence improving reliability.

10. The method of claim 1, wherein the unique copper metal alloyed conducting interconnect lines and via structures, produced by this process, have good adhesion properties with insulating films and resist both oxidation/corrosion and electromigration, hence improving reliability.

* * * * *